(12) United States Patent
Sekaric et al.

(10) Patent No.: US 7,902,541 B2
(45) Date of Patent: Mar. 8, 2011

(54) SEMICONDUCTOR NANOWIRE WITH BUILT-IN STRESS

(75) Inventors: Lidija Sekaric, Mount Kisco, NY (US); Dureseti Chidambarrao, Weston, CT (US); Xiao H. Liu, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 12/417,819

(22) Filed: Apr. 3, 2009

(65) Prior Publication Data
US 2010/0252801 A1    Oct. 7, 2010

(51) Int. Cl.
*H01L 29/06* (2006.01)
(52) U.S. Cl. ............ 257/9; 257/12; 257/18; 257/E51.04; 438/20; 977/762; 977/938
(58) Field of Classification Search .............. 257/9, 12, 257/18, E51.04; 438/20; 977/762, 938
See application file for complete search history.

(56) References Cited

U.S. PATENT DOCUMENTS

| | | | |
|---|---|---|---|
| 6,231,744 B1 | 5/2001 | Ying et al. |
| 6,248,674 B1 | 6/2001 | Kamins et al. |
| 6,656,573 B2 | 12/2003 | Chen et al. |
| 6,720,240 B2 | 4/2004 | Gole et al. |
| 6,798,000 B2 | 9/2004 | Luyken |
| 6,831,017 B1 | 12/2004 | Li et al. |
| 6,841,235 B2 | 1/2005 | Weiner et al. |
| 6,843,902 B1 | 1/2005 | Penner et al. |
| 6,882,051 B2 | 4/2005 | Majumdar et al. |
| 6,897,098 B2 | 5/2005 | Hareland et al. |
| 6,969,679 B2 | 11/2005 | Okamura et al. |
| 7,067,328 B2 | 6/2006 | Dubrow et al. |
| 7,067,341 B2 | 6/2006 | Mascolo et al. |
| 7,081,293 B2 | 7/2006 | Weiner |
| 7,135,728 B2 | 11/2006 | Duan et al. |
| 7,164,209 B1 | 1/2007 | Duan et al. |
| 7,176,505 B2 | 2/2007 | Rueckes et al. |
| 7,182,996 B2 | 2/2007 | Hong |
| 7,183,568 B2 | 2/2007 | Appenzeller et al. |

(Continued)

OTHER PUBLICATIONS

Chang et al., "CMOS Circuit Performance Enhancement by Surface Orientation Optimization", IEEE Transactions on Electron Devices, Oct. 2004, pp. 1621-1627, vol. 51.

*Primary Examiner* — Kimberly D Nguyen
*Assistant Examiner* — Jami M Valentine
(74) *Attorney, Agent, or Firm* — Scully, Scott, Murphy & Presser, P.C.; H. Daniel Schnumann

(57) ABSTRACT

A semiconductor nanowire having two semiconductor pads on both ends is suspended over a substrate. Stress-generating liner portions are formed over the two semiconductor pads, while a middle portion of the semiconductor nanowire is exposed. A gate dielectric and a gate electrode are formed over the middle portion of the semiconductor nanowire while the semiconductor nanowire is under longitudinal stress due to the stress-generating liner portions. The middle portion of the semiconductor nanowire is under a built-in inherent longitudinal stress after removal of the stress-generating liners because the formation of the gate dielectric and the gate electrode locks in the strained state of the semiconductor nanowire. Source and drain regions are formed in the semiconductor pads to provide a semiconductor nanowire transistor. A middle-of-line (MOL) dielectric layer may be formed directly on the source and drain pads.

24 Claims, 11 Drawing Sheets

U.S. PATENT DOCUMENTS

| | | |
|---|---|---|
| 7,189,635 B2 | 3/2007 | Sharma |
| 7,208,094 B2 | 4/2007 | Islam et al. |
| 7,211,464 B2 | 5/2007 | Lieber et al. |
| 7,217,946 B2 | 5/2007 | Fraboulet et al. |
| 2002/0014667 A1 | 2/2002 | Shin et al. |
| 2004/0112964 A1* | 6/2004 | Empedocles et al. ......... 235/491 |
| 2006/0105513 A1 | 5/2006 | Afzali-Ardakani et al. |
| 2006/0151844 A1 | 7/2006 | Avouris et al. |
| 2007/0164839 A1* | 7/2007 | Naito ............................ 333/186 |
| 2009/0146194 A1* | 6/2009 | Moselund et al. ............ 257/288 |

* cited by examiner

SEMICONDUCTOR NANOWIRE WITH BUILT-IN STRESS

FIELD OF THE INVENTION

The present invention relates to semiconductor devices, and particularly to semiconductor nanowires having built-in stress and methods of manufacturing the same.

BACKGROUND OF THE INVENTION

A semiconductor nanowire refers to a semiconductor wire having transverse lateral and vertical dimensions of the order of a nanometer ($10^{-9}$ meter) or tens of nanometers. Typically, the transverse lateral dimension and the vertical dimension are less than 20 nm.

The limitation on the lateral dimension applies to the transverse lateral dimension (the width) and the vertical lateral dimension (the height). The longitudinal lateral dimension (the length) of the semiconductor nanowire is unlimited, and may be, for example, from 1 nm to 1 mm. When the lateral dimensions of the semiconductor nanowire is less than tens of nanometers, quantum mechanical effects become important. As such, semiconductor nanowires are also called semiconductor quantum wires.

The transverse lateral dimension of a semiconductor nanowire is currently sublithographic, i.e., may not be printed by a direct image transfer from a photoresist that is patterned by a single exposure. As of 2008, the critical dimension, i.e., the smallest printable dimension that may be printed by lithographic methods, is about 35 nm. Dimensions less than the critical dimension are called sublithographic dimensions. At any given time, the critical dimension and the range of the sublithographic dimension are defined by the best available lithographic tool in the semiconductor industry. In general, the critical dimension and the range of the sublithographic dimension decreases in each successive technology node and established by a manufacturing standard accepted across the semiconductor industry.

A semiconductor nanowire enables enhanced control of the charge carriers along the lengthwise direction through a complete encirclement of the cross-sectional area of the semiconductor nanowire by a gate dielectric and a gate electrode. The charge transport along the semiconductor nanowire by the gate electrode is better controlled in a semiconductor nanowire device than in a fin field effect transistor (finFET) because of the complete encirclement of the semiconductor nanowire.

For high performance complementary metal-on-semiconductor (CMOS) circuit, high performance semiconductor nanowire devices that provide high on-current are desired.

SUMMARY OF THE INVENTION

The present invention provides structures and fabrication methods for semiconductor nanowire transistors that have a built-in inherent longitudinal stress along the direction of the current flow in the semiconductor nanowire so that charge carrier mobility and on-current for the semiconductor nanowire transistors.

A semiconductor nanowire having two semiconductor pads on both ends is suspended over a substrate. Stress-generating liner portions are formed over the two semiconductor pads, while a middle portion of the semiconductor nanowire is exposed. A gate dielectric and a gate electrode are formed over the middle portion of the semiconductor nanowire while the semiconductor nanowire is under longitudinal stress due to the stress-generating liner portions. The middle portion of the semiconductor nanowire is under a built-in inherent longitudinal stress after removal of the stress-generating liners because the formation of the gate dielectric and the gate electrode locks in the strained state of the semiconductor nanowire. Source and drain regions are formed in the semiconductor pads to provide a semiconductor nanowire transistor. A middle-of-line (MOL) dielectric layer may be formed directly on the source and drain pads.

According to an aspect of the present invention, a semiconductor structure is provided, which includes: a semiconductor nanowire adjoined to a first semiconductor pad and a second semiconductor pad, wherein a middle portion of the semiconductor wire is longitudinally strained; a gate dielectric surrounding the longitudinally strained middle portion of the semiconductor nanowire; and a dielectric material layer embedding the first and second semiconductor pads, wherein the dielectric material layer is substantially stress-free.

According to another aspect of the present invention, a method of forming a semiconductor structure is provided, which includes: forming a semiconductor nanowire on a substrate, wherein the semiconductor nanowire is adjoined to a first semiconductor pad and a second semiconductor pad, and wherein the semiconductor nanowire is suspended over the substrate; inducing longitudinal strain in a middle portion of the semiconductor nanowire by forming a first stress-generating material portion on the first semiconductor pad and a second stress-generating material portion on the second semiconductor pad; forming a gate dielectric directly on the middle portion of the semiconductor nanowire while the middle portion is under the longitudinal strain; and removing the first stress-generating material portion and the second stress-generating material portion, wherein the middle portion of the semiconductor nanowire is longitudinally strained after removal of the first stress-generating material portion and the second stress-generating material portion.

DETAILED DESCRIPTION OF THE INVENTION

Figure 1A:
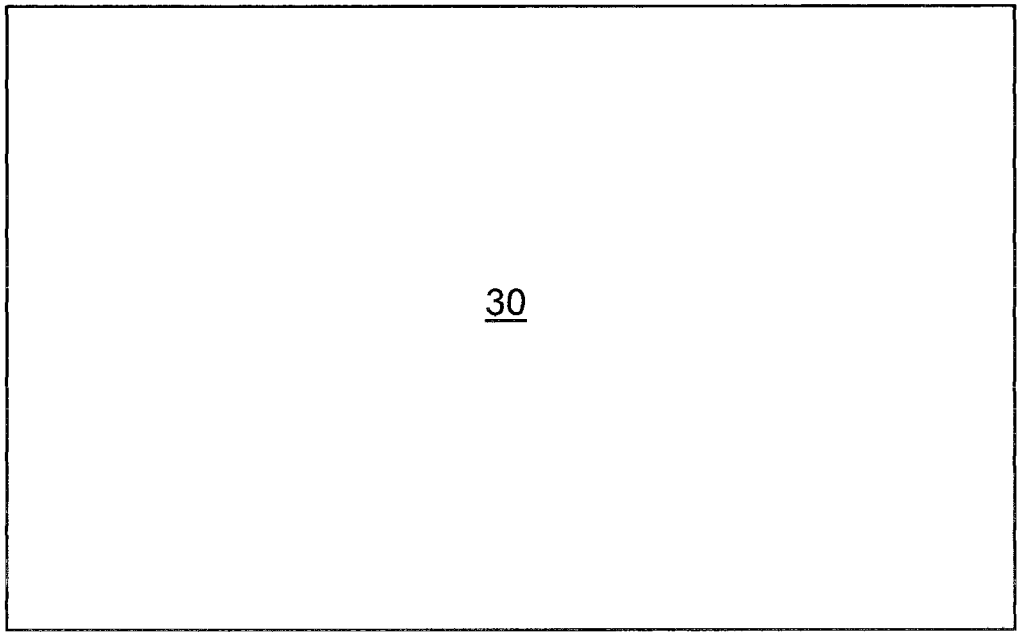
FIG. 1A is a top-down view of an exemplary semiconductor structure when provided as a semiconductor-on-insulator (SOI) substrate.

As stated above, the present invention relates to semiconductor nanowires having built-in stress and methods of manufacturing the same, which are now described in detail with accompanying figures. It is noted that like and corresponding elements are referred to by like reference numerals.

Figure 1B:
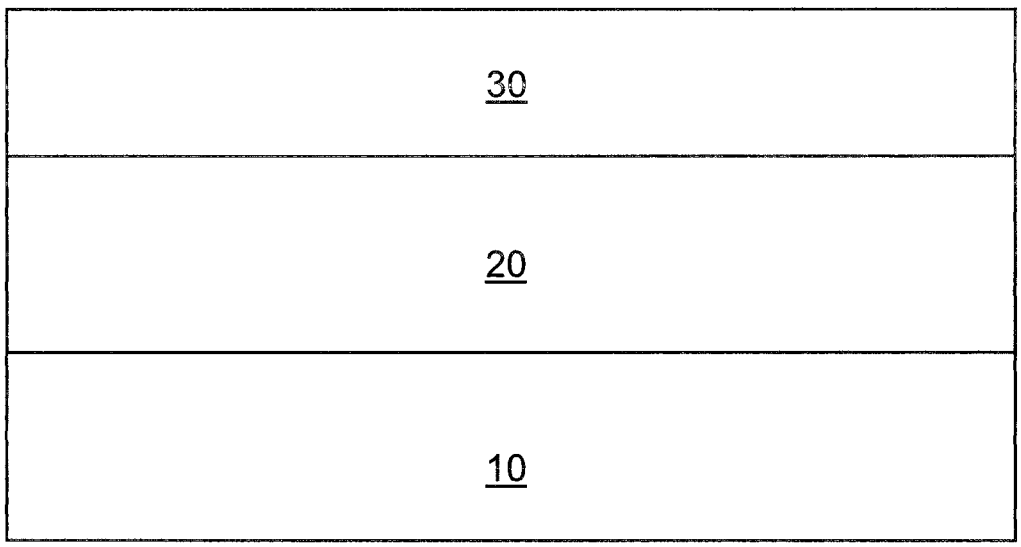
FIG. 1B is a vertical cross-sectional view of the exemplary semiconductor structure along the plane B-B' at the step corresponding to FIG. 1A.

Referring to FIGS. 1A and 1B, an exemplary semiconductor structure according to the present invention includes a semiconductor-on insulator (SOI) substrate which contains a handle substrate 10, a buried insulator layer 20, and a top semiconductor layer 30. The top semiconductor layer 30 comprises a semiconductor material, which may be selected from, but is not limited to silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In one embodiment, the top semiconductor layer 30 may include a Si-containing semiconductor material such as single crystalline silicon or a single crystalline silicon-germanium alloy.

Preferably, the entirety of the semiconductor material within the top semiconductor layer 30 is single crystalline material, i.e., has an epitaxial atomic alignment throughout. In this case, the crystallographic orientation of the surface normal of the top surface of the top semiconductor layer 30 is herein referred to as a surface orientation of the top surface of the top semiconductor layer 30. The thickness of the top semiconductor layer 30 may be from 10 nm to 200 nm, although lesser and greater thicknesses are also contemplated herein.

The top semiconductor layer 30 may be doped with electrical dopants as needed. The top semiconductor layer 30 may be provided as a substantially intrinsic semiconductor layer, or may be provided with p-type doping or n-type doping. Typically, the dopant concentration in doped regions is in the range from $5.0 \times 10^{14}/cm^3$ to $3.0 \times 10^{17}/cm^3$, although lesser and greater dopant concentrations are also contemplated herein.

The buried insulator layer 20 is a dielectric material layer, i.e., a layer including a dielectric material. The dielectric material of the buried insulator layer 20 may be, for example, silicon oxide, silicon nitride, silicon oxynitride, quartz, a ceramic material, or a combination thereof. The thickness of the buried insulator layer 20 may be from 50 nm to 1,000 nm, although lesser and greater thicknesses are also contemplated herein. The handle substrate 10 may comprise a semiconductor material, an insulator material, or a conductive material. In some cases, the handle substrate 10 and the buried insulator layer 20 may comprise the same dielectric material and may be of unitary and integral construction.

Figure 2A:
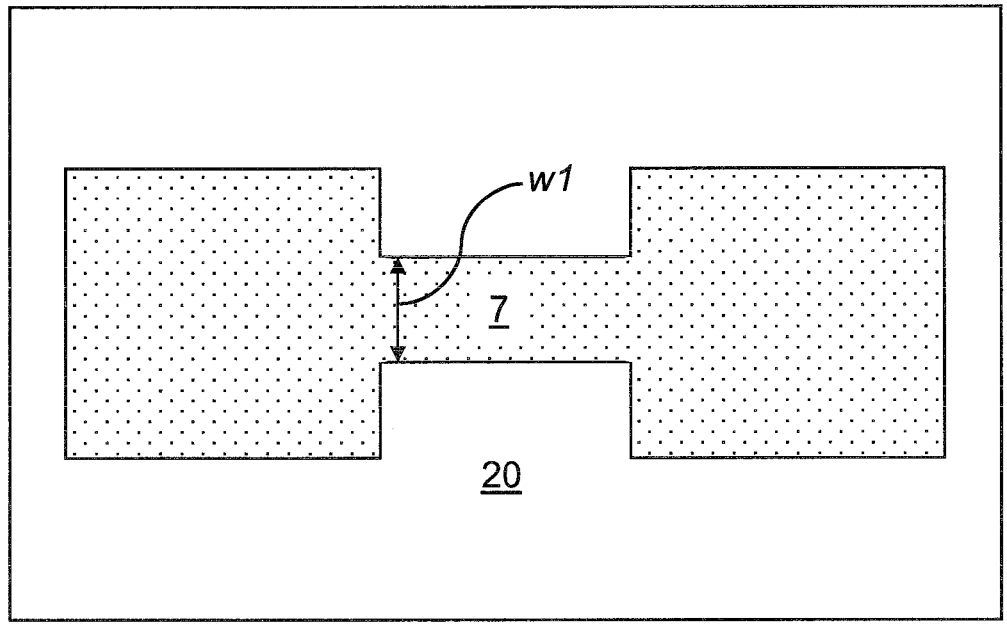
FIG. 2A is a top-down view of the exemplary semiconductor structure after patterning of semiconductor link portions and semiconductor pads.
Figure 2B:
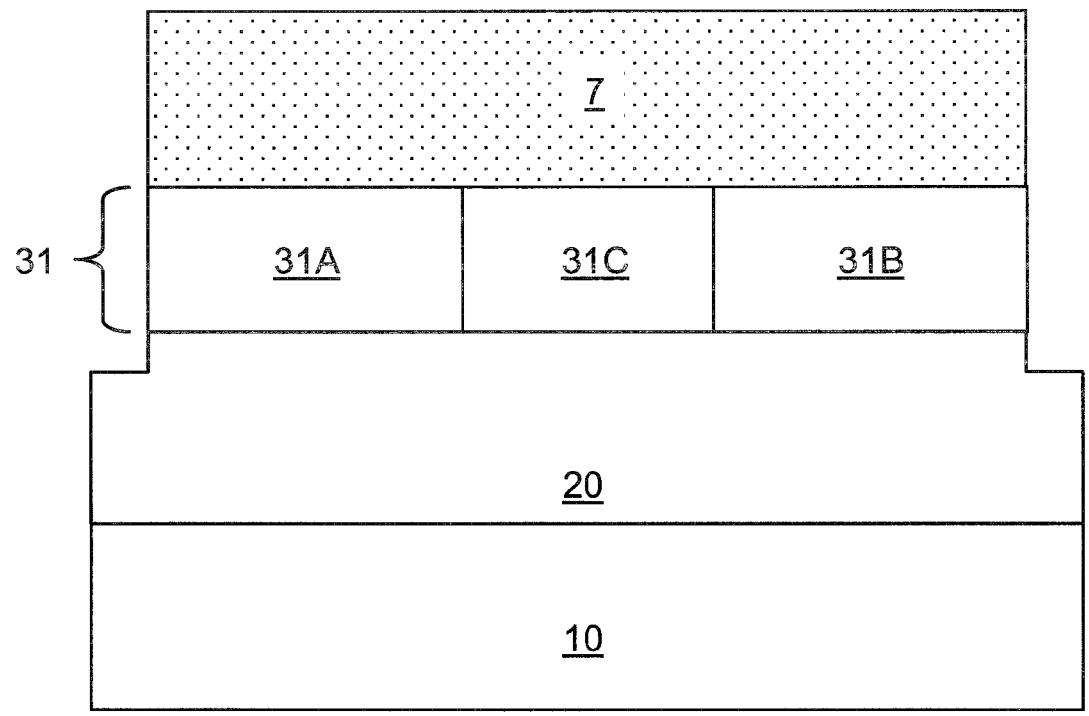
FIG. 2B is a vertical cross-sectional view of the exemplary semiconductor structure along the plane B-B' at the step corresponding to FIG. 2A.

Referring to FIGS. 2A and 2B, a photoresist 7 is applied to the top surface of the top semiconductor layer 30 and is lithographically patterned to form a patterned shape. The patterned shape includes a link shape, a first pad shape, and a second pad shape. The link shape which has a rectangular shape in a top-down view. The width of the link shape, which is herein referred to as a first width w1, is a lithographic dimension, i.e., a dimension that may be printed with a single lithographic exposure. Thus, the first width w1 is greater than 40 µm, while it is contemplated that a lesser width may be formed as lithography tools improve in the future. Typically, the first width w1 is a critical dimension, i.e., lithographically printable minimum dimension, or a dimension close to the critical dimension.

The link shape is laterally adjoined by the first pad shape and the second pad shape, which have wider widths than the link shape. The horizontal direction that is perpendicular to the direction of the first width w1 is herein referred to as a lengthwise direction. The direction of the first width w1 is herein refereed to as a widthwise direction. The first pad shape laterally abuts the link shape at a lengthwise end of the link shape, and the second pad shape laterally abuts the link shape at the opposite lengthwise end of the link shape.

Preferably, the lengthwise direction is selected to include vertical planes at which hole mobility or electron mobility is at a local maximum at least, and preferably at maximum among all vertical planes in the single crystalline semiconductor layer constituting the top semiconductor layer 30. In case the top semiconductor layer 30 is doped with dopants of a first conductivity type, the lengthwise direction may be selected to maximize the mobility of charge carriers of the second conductivity type, which is the opposite of the first conductivity type. For example, if the first conductivity type is n-type and the second conductivity type is p-type, the lengthwise direction may be selected to include a vertical crystallographic plane that maximizes hole mobility. In case the top semiconductor layer 30 comprises single crystalline silicon, a {110} plane maximizes hole mobility. If the first conductivity type is p-type and the second conductivity type is n-type, the lengthwise direction may be selected to include a vertical crystallographic plane that maximizes electron mobility. In case the top semiconductor layer 30 comprises single crystalline silicon, a {100} plane maximizes electron mobility.

The pattern in the photoresist 7 is transferred into the top semiconductor layer 30 and an upper portion of the buried insulator layer 20, for example, by an anisotropic etch. The exposed portions of the top semiconductor layer 30 and the upper portions of the buried insulator layer 20 directly underneath are removed by the anisotropic etch. The remaining portions of the top semiconductor layer 30 include a patterned semiconductor structure 31. The patterned semiconductor structure 31 includes a semiconductor link portion 31C, a first pad 31A laterally abutting the semiconductor link portion 31C on one side, and a second pad 31B laterally abutting the semiconductor link portion 31C on an opposite side.

The exposed sidewalls of the patterned semiconductor structure 31 are substantially vertically coincident with the sidewalls of the photoresist 7. Further, the sidewalls of the patterned portions of the buried insulator layer 20 are substantially vertically coincident with the sidewalls of the photoresist 7 and the sidewalls of the patterned semiconductor structure 31. The semiconductor link portion 31C has a pair of sidewalls that are separated by the first width w1. The height of the patterned semiconductor structure 31 may be uniform throughout if the thickness of the top semiconductor layer 30 prior to patterning. The photoresist 7 is subsequently removed, for example, by ashing.

Figure 3A:
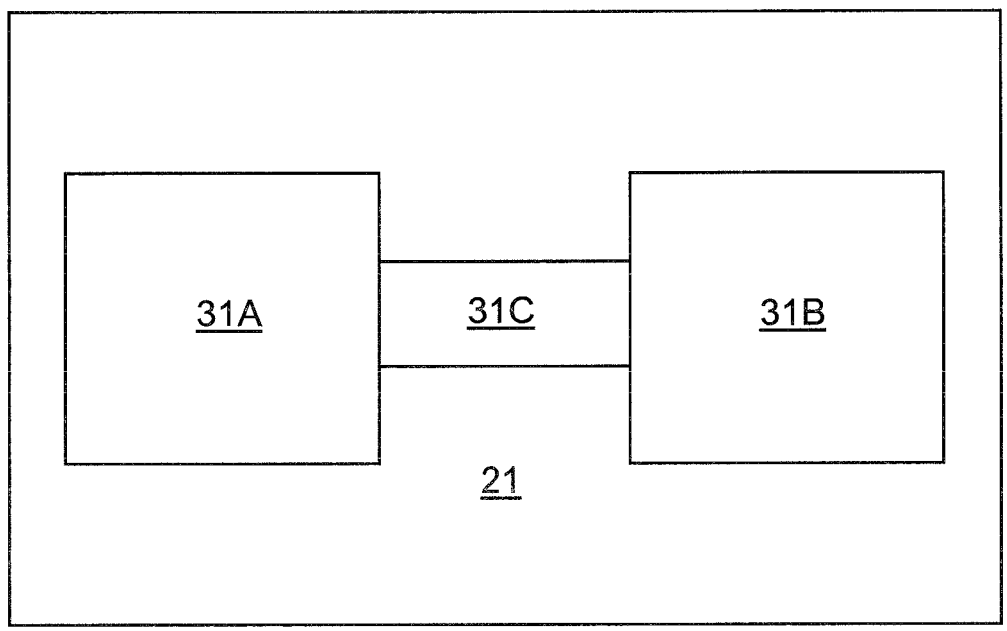
FIG. 3A is a top-down view of the exemplary semiconductor structure after formation of dielectric pedestals.
Figure 3B:
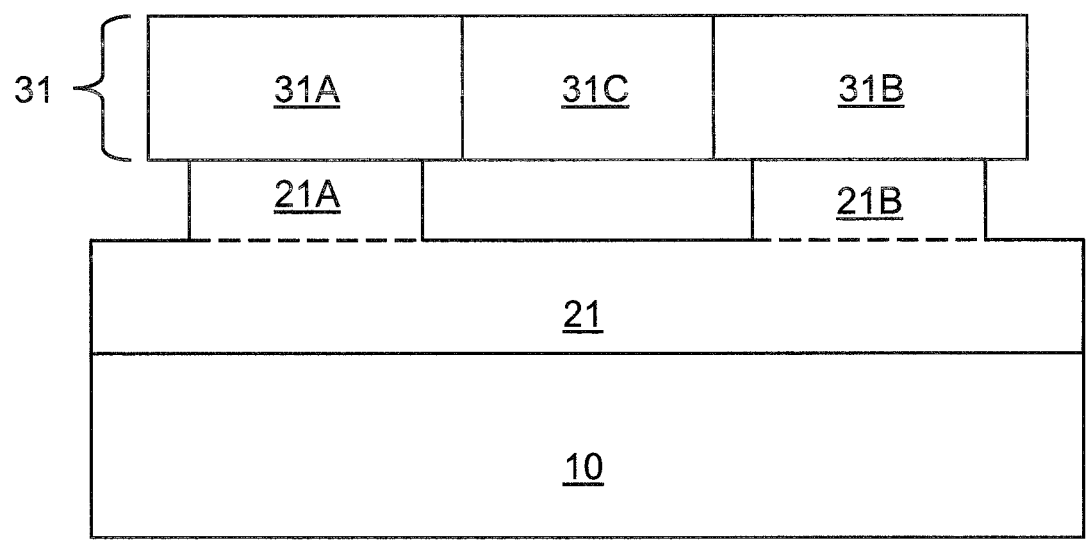
FIG. 3B is a vertical cross-sectional view of the exemplary semiconductor structure along the plane B-B' at the step corresponding to FIG. 3A.

Referring to FIGS. 3A and 3B, a substantially isotropic etch is performed on the dielectric material of the buried insulator layer 20 selective to the semiconductor material of the patterned semiconductor structure 31. The patterned semiconductor structure 31 is employed as an etch mask for the substantially isotropic etch. The substantially isotropic etch may be a wet etch or a dry etch. Because the etch is substantially isotropic, the edges of the patterned semiconductor structure 31 are undercut as the etch progresses. The etch proceeds at least until the portions of the buried insulator layer 20 located directly underneath the patterned semiconductor structure 31 are removed so that the patterned semiconductor structure 31 becomes suspended over the remaining portions of the buried insulator layer 20. In other words, the patterned semiconductor structure 31 does not have direct physical contact with the remaining portions of the buried insulator layer 20, which is herein referred to as an intermediate dielectric material layer 21, after the etch.

The etch also removes the dielectric material of the buried insulator layer 20 from underneath the peripheral portions of the first pad 31A and the second pad 31B. A first prototypical dielectric pedestal 21A comprising a remaining portion of the buried insulator layer 20 is formed directly underneath a center portion of the first pad 31A. Likewise, a second prototypical dielectric pedestal 21B is formed directly underneath a center portion of the second pad 31B. As the dielectric material is etched from underneath peripheral portions of the patterned semiconductor structure 31 employing the patterned semiconductor structure 31 as an etch mask, the buried insulator layer 20, which is a dielectric material layer, is undercut beneath the semiconductor link portion 31C.

The semiconductor link portion 31C is suspended over a remaining portion of the buried insulator layer 20, which is the intermediate dielectric material layer 21. The first and second prototypical dielectric pedestals (21A, 21B) are integrally formed with the intermediate dielectric material layer 21, and are portions of the intermediate dielectric material layer 21. The patterned semiconductor structure 31 contact the intermediate dielectric material layer 21, which incorporates the first and second prototypical dielectric pedestals (21A, 21B), at bottom surfaces of the first pad 31A and the second pad 31B.

Figure 4A:
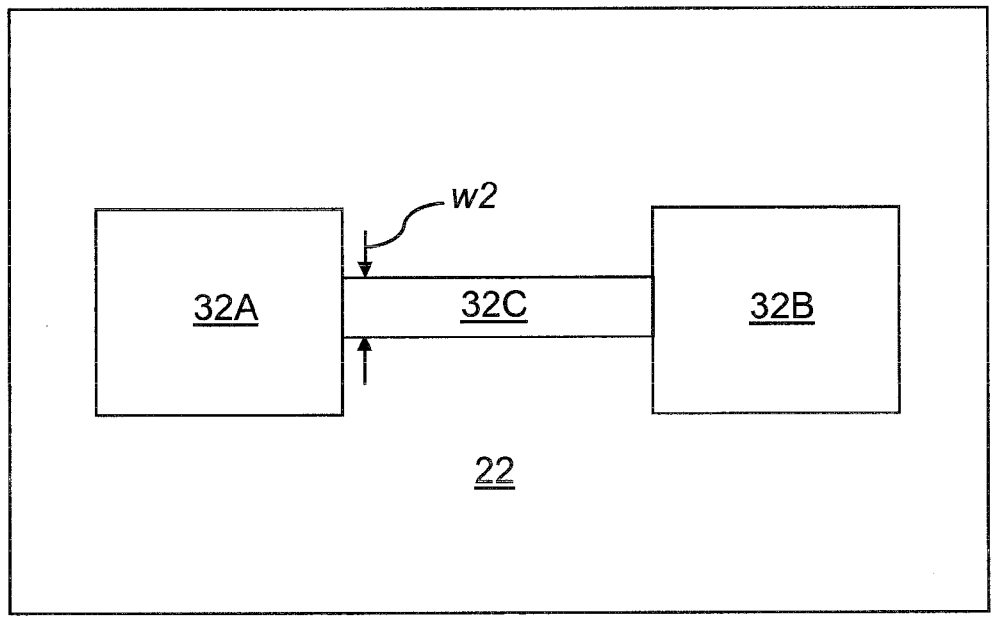
FIG. 4A is a top-down view of the exemplary semiconductor structure after formation of semiconductor nanowires.
Figure 4B:
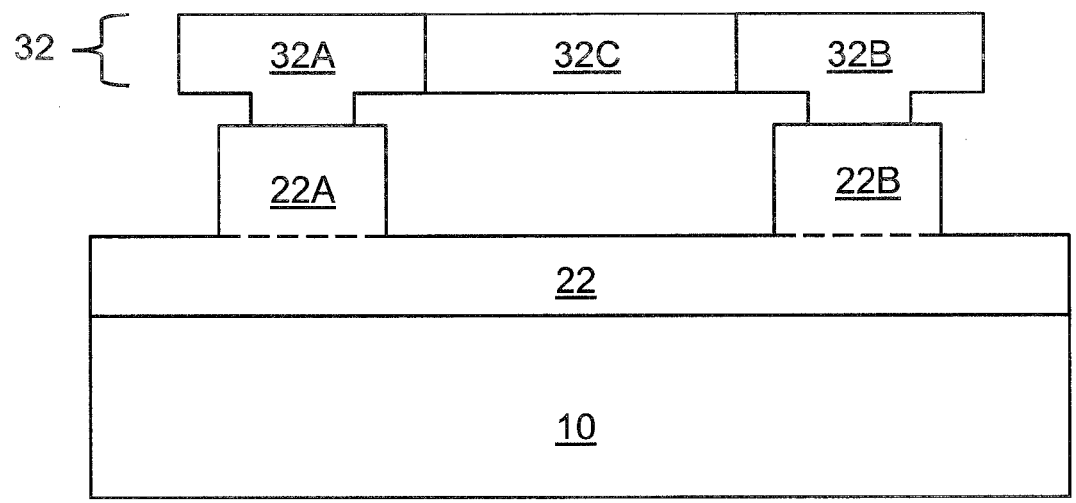
FIG. 4B is a vertical cross-sectional view of the exemplary semiconductor structure along the plane B-B' at the step corresponding to FIG. 4A.

Referring to FIGS. 4A and 4B, the patterned semiconductor structure 31 is thinned to form a semiconductor nanowire structure 32, i.e., dimensions of the patterned semiconductor structure 31 are reduced, for example, by oxidation. Specifically, exposed peripheral portions of the patterned semiconductor structure 31 including the semiconductor link 31C are converted into oxide material portions by oxidation. The semiconductor oxide material is subsequently removed by an isotropic etch such as a wet etch. For example, if the patterned semiconductor structure 31 includes silicon, the semiconductor oxide material may be silicon oxide, which may be removed by hydrofluoric acid (HF). Alternately, an isotropic wet etch or an isotropic dry etch may be employed to thin the patterned semiconductor structure 31 by removing the exposed outer portions of the semiconductor material.

The semiconductor nanowire structure 32, which is the remaining portions of the patterned semiconductor structure 31, includes a first semiconductor pad 32A, a second semiconductor pad 32B, and a semiconductor nanowire 32C. The first semiconductor pad 32A and the second semiconductor pad 32B laterally abut the semiconductor nanowire 32C.

The semiconductor nanowire 32C may have a rectangular vertical cross-sectional area in a plane perpendicular to the lengthwise direction. The width of the semiconductor nanowire 32C, which is the dimension of the semiconductor nanowire 32C in the widthwise direction between the pair of first sidewalls as recessed by the thinning, is herein referred to as a second width w2. The second width w2 is less than the first width w1 because the semiconductor material is consumed during the thinning process. Preferably, the second width w2 is a sublithographic dimension, i.e., a dimension that is less than the smallest dimension that may be printed with a single lithographic exposure on a photoresist. Typically, the second width w2 is from 1 nm to 20 nm, although lesser and greater dimensions are also contemplated herein. Preferably, the second width w2 is from 2 nm to 10 nm.

In case the intermediate dielectric material layer 21 includes a material that is removed by the etch employed to remove the oxidized material of the patterned semiconductor structure, the exposed portions of the intermediate dielectric material layer 21 may also be etched. In this case, the horizontal portion of the intermediate dielectric material layer 21 is recessed to form a dielectric material layer 22 and the first and second prototypical dielectric pedestals (21A, 21B) are laterally etched to form first and second dielectric pedestals (22A, 22B), respectively. The dielectric material layer 22 is formed integrally with, and includes, the first and second dielectric pedestals (22A, 22B). The dielectric material layer 22 is a remaining portion of the buried insulator layer 20 that is provided as a component of the SOI substrate (See FIGS. 1A and 1B).

The lengthwise directions of the semiconductor nanowire 32C may be selected to include a vertical plane that provides the maximum hole mobility or the maximum electron mobility among all vertical crystallographic planes of the single crystalline semiconductor material of the semiconductor nanowire 32C. If the semiconductor nanowire 32C has an n-type doping, the pair of sidewalls may be parallel to a vertical plane at which hole mobility is at maximum among all vertical planes in the single crystalline semiconductor material constituting the semiconductor nanowire 32C. Conversely, if the semiconductor nanowire 32C has a p-type doping, the pair of sidewalls may be parallel to a vertical plane at which electron mobility is at maximum among all vertical planes in the single crystalline semiconductor material constituting the semiconductor nanowire 32C.

Figure 5A:
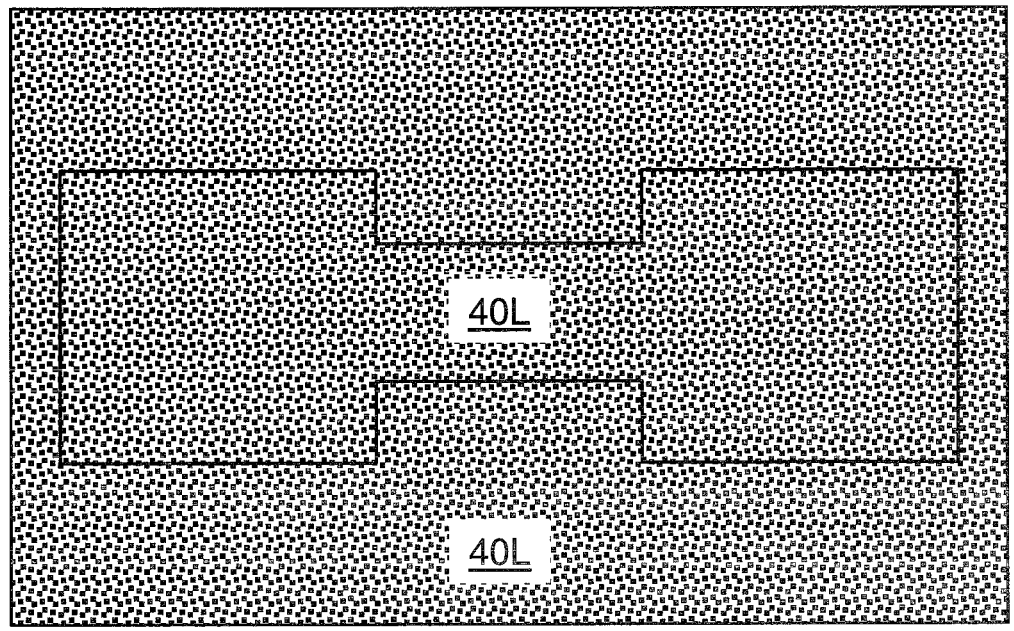
FIG. 5A is a top-down view of the exemplary semiconductor structure after formation of a stress-generating material layer.
Figure 5B:
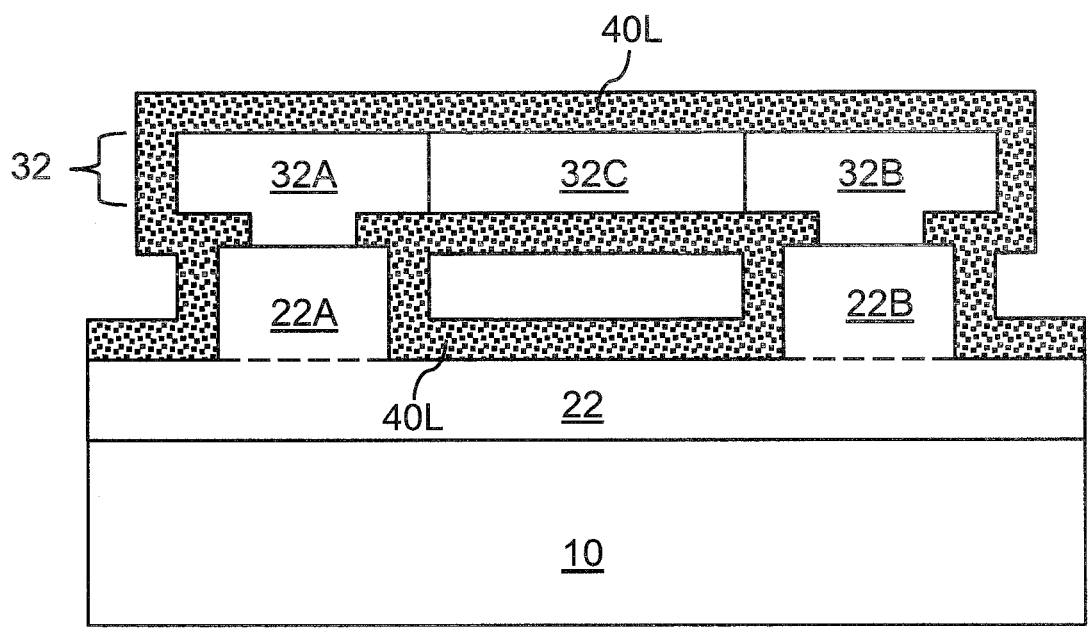
FIG. 5B is a vertical cross-sectional view of the exemplary semiconductor structure along the plane B-B' at the step corresponding to FIG. 5A.

Referring to FIGS. 5A and 5B, a stress-generating material layer 40L is deposited on the semiconductor nanowire structure 32 and the dielectric material layer 22. The stress-generating material layer 40L comprises a different material than the material of the semiconductor nanowire structure 32 and the material of the dielectric material layer 22. The stress-generating material layer 40L may comprise a dielectric material, a semiconductor material, a conductive material, or a combination thereof. For example, the stress-generating material layer 40L may comprise a silicon nitride having a high inherent stress greater than 0.3 GPa in magnitude. The stress-generating material layer 40L may apply a tensile stress or a compressive stress to the semiconductor nanowire 32C, which is laterally enclosed by the stress-generating material layer 40L in the plane perpendicular to the lengthwise direction of the semiconductor nanowire 32C. The thickness of the stress-generating material layer 40L is preferably less than half of the distance between a bottom surface of the semiconductor nanowire 32C and a top surface of the dielectric material layer 22 located directly underneath so that the space beneath the semiconductor nanowire 32C is not plugged with the stress-generating material layer 40L. The thickness of the stress-generating material layer 40L is typically from 10 nm to 500 nm, although lesser and greater thicknesses are also contemplated herein.

Figure 6A:
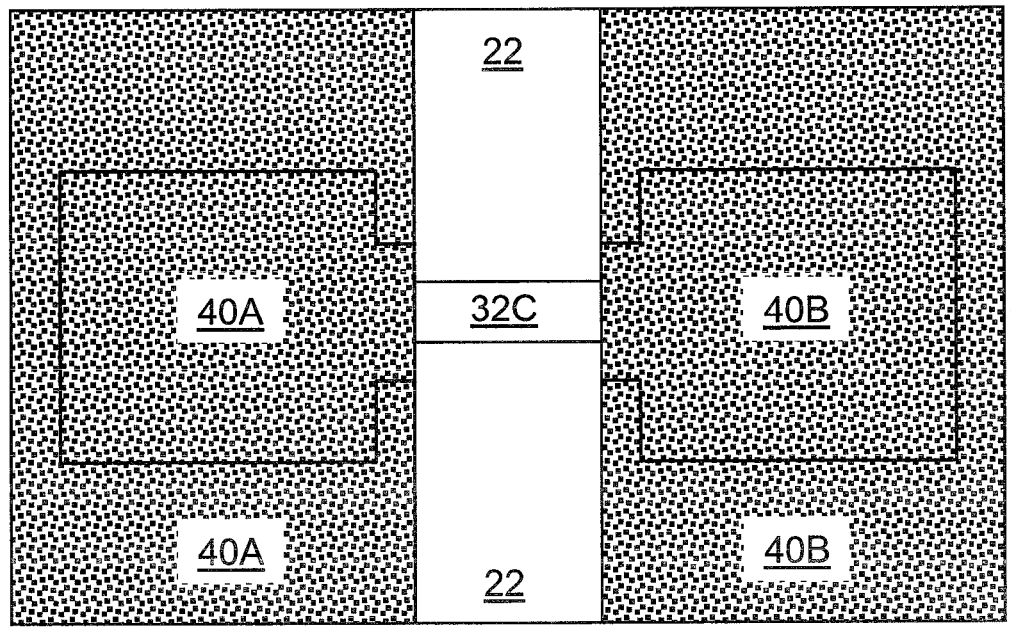
FIG. 6A is a top-down view of the exemplary semiconductor structure after formation of stress-generating material portions.
Figure 6B:
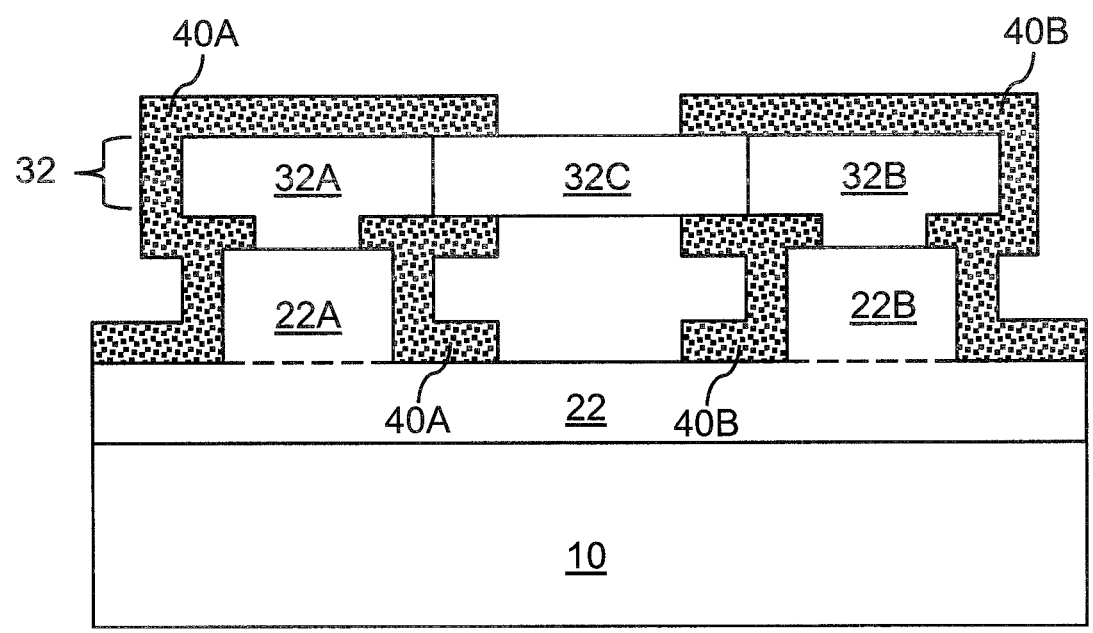
FIG. 6B is a vertical cross-sectional view of the exemplary semiconductor structure along the plane B-B' at the step corresponding to FIG. 6A.

Referring to FIGS. 6A and 6B, the stress-generating material layer 40L is lithographically patterned to form a first stress-generating portion 40A and a second stress-generating portion 40B. The first stress-generating portion 40A is formed on the first semiconductor pad 32A and an end portion of the semiconductor nanowire 32C that is directly adjoined to the first semiconductor pad 32A. The second stress-generating portion 40B is formed on the second semiconductor pad 32B and an end portion of the semiconductor nanowire 32C that is directly adjoined to the second semiconductor pad 32B. The first and second stress-generating portions (40A, 40B) may be formed, for example, by applying a photoresist (not shown) on the stress-generating material layer 40L and patterning the photoresist, followed by an etch that transfers the pattern in the photoresist into the stress-generating material layer 40L by removing the exposed portions of the stress-generating material layer 40L. Geometrically shielded portions of the stress-generating material layer 40L, for example, on the bottom surface of the middle portion of the semiconductor nanowire 32C, may be removed by offsetting the edges of the photoresist and employing an isotropic etch to undercut the stress-generating material layer 40L beneath the edge regions of the patterned photoresist.

As the stress-generating material layer 40L is removed from around the middle portion of the semiconductor nanowire 32C, the middle portion of the semiconductor nanowire 32C is subjected to a longitudinal strain. If the stress-generating material layer 40L generates a compressive stress on an adjoining structure, the stress-generating material portions (40A, 40B) apply a compressive stress to the first semiconductor pad 32A and the second semiconductor pad 32B, respectively. In this case, the first semiconductor pad 32A and the second semiconductor pad 32B become compressively strained. In the compressively strained state, the first semiconductor pad 32A and the second semiconductor pad 32B pull the semiconductor nanowire 32C on both ends, and the semiconductor nanowire 32C is subjected to a longitudinal tensile stress and develops longitudinal tensile strain, i.e., becomes strained along the lengthwise direction of the semiconductor nanowire 32C with a tensile strain. A longitudinal compressive stress on the semiconductor nanowire 32C accompanies the longitudinal compressive strain.

Alternately, if the stress-generating material layer 40L generates a tensile stress on an adjoining structure, the stress-generating material portions (40A, 40B) apply a tensile stress to the first semiconductor pad 32A and the second semiconductor pad 32B, respectively. In this case, the first semiconductor pad 32A and the second semiconductor pad 32B become tensile strained. In the tensile strained state, the first semiconductor pad 32A and the second semiconductor pad 32B push the semiconductor nanowire 32C on both ends, and the semiconductor nanowire 32C is subjected to a longitudinal compressive stress and develops longitudinal compressive strain, i.e., becomes strained along the lengthwise direction of the semiconductor nanowire 32C with a compressive strain. A longitudinal tensile stress on the semiconductor nanowire 32C accompanies the longitudinal tensile strain.

Figure 7A:
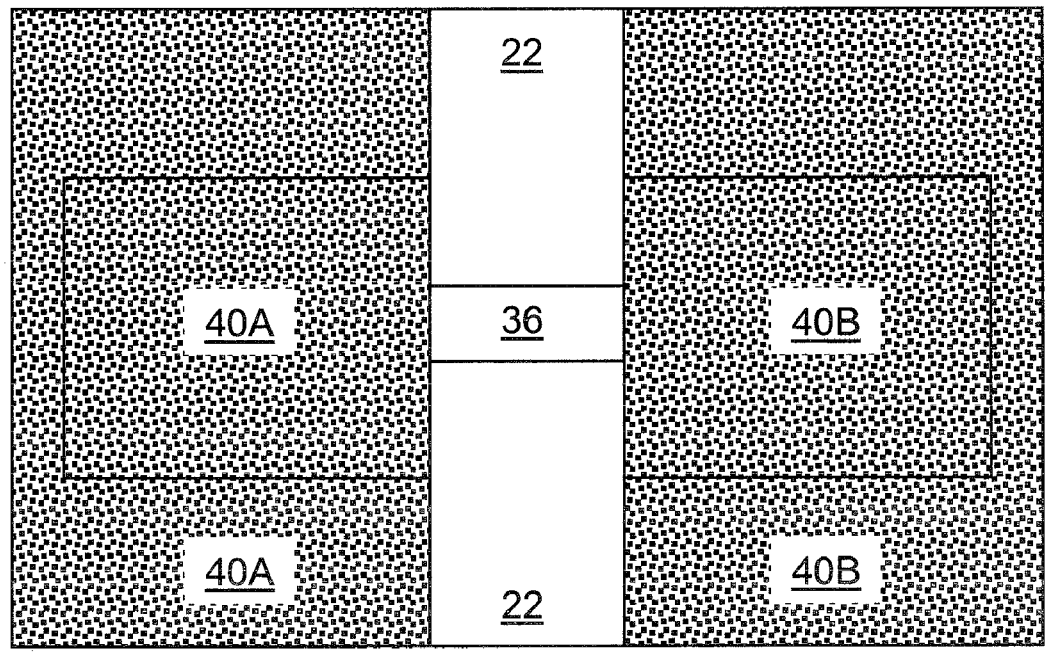
FIG. 7A is a top-down view of the exemplary semiconductor structure after formation of gate dielectrics.
Figure 7B:
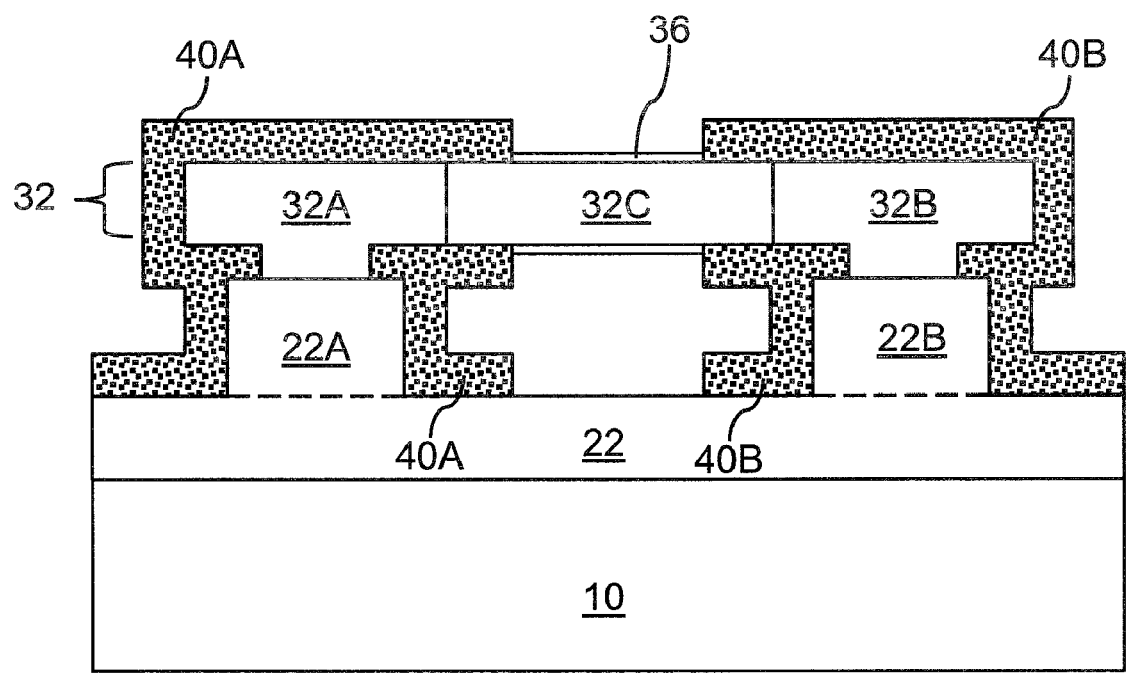
FIG. 7B is a vertical cross-sectional view of the exemplary semiconductor structure along the plane B-B' at the step corresponding to FIG. 7A.

Referring to FIGS. 7A and 7B, a gate dielectric 36 is formed on the exposed surfaces of the semiconductor nanowire 32C between the first and second stress-generating material portions (40A, 40B). The gate dielectric 36 is formed directly on the middle portion of the semiconductor nanowire 32C while the semiconductor nanowire is longitudinally strained, either compressively or tensile. Thus, the length of the middle portion of the semiconductor nanowire 32C is either less than, or greater than, an equilibrium length of the middle portion of the semiconductor nanowire 32C in the absence of any longitudinal strain. Atomic registry between the atoms of the gate dielectric 36 and the atoms of the middle portion of the semiconductor nanowire 32C is established during the formation of the gate dielectric 36C while the middle portion of the semiconductor nanowire 32C is longitudinally strained.

In one case, the gate dielectric 36 comprises a dielectric material formed by thermal conversion of outer portions of the semiconductor nanowire 32C, such as silicon oxide or silicon nitride. Thermal oxidation, thermal nitridation, plasma oxidation, plasma nitridation, or a combination thereof may be employed to form the gate dielectric 36. In this case, the gate dielectric 36 is formed only on the exposed surfaces of the middle portion of the semiconductor nanowire 32C. The thickness of the gate dielectric 36 may be from about 0.8 nm to about 10 nm, and is typically from about 1.1 nm to about 6 nm.

In another case, the gate dielectric 36 may comprise a high-k dielectric material having a dielectric constant greater than 3.9, i.e., the dielectric constant of silicon oxide. The high-k dielectric material may comprise a dielectric metal oxide containing a metal and oxygen. Preferably, the dielectric constant of the high-k material is greater than or about 4.0. More preferably, the dielectric constant of the high-k dielectric material is greater than the dielectric constant of silicon nitride, which is about 7.5. Even more preferably, the dielectric constant of the high-k dielectric material is greater than 8.0. The high-k dielectric materials are also known in the art as high-k gate dielectric materials, which include dielectric metal oxides, alloys thereof, and silicate alloys thereof. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. Optionally, an interfacial layer (not shown), for example, silicon oxide, can be formed by chemical oxidation or thermal oxidation before the high-k dielectric material is deposited. In this case, the gate dielectric 36 may be formed as a single contiguous gate dielectric layer covering the entirety of the top surfaces and sidewall surfaces of the semiconductor nanowire structure 32 and all exposed surfaces of the dielectric material layer 22 including the first and second dielectric pedestals (22A, 22B). In this case, the thickness of the gate dielectric 36 may be from about 1 nm to about 6 nm, and may have an effective oxide thickness on the order of or less than 1 nm.

Figure 8A:
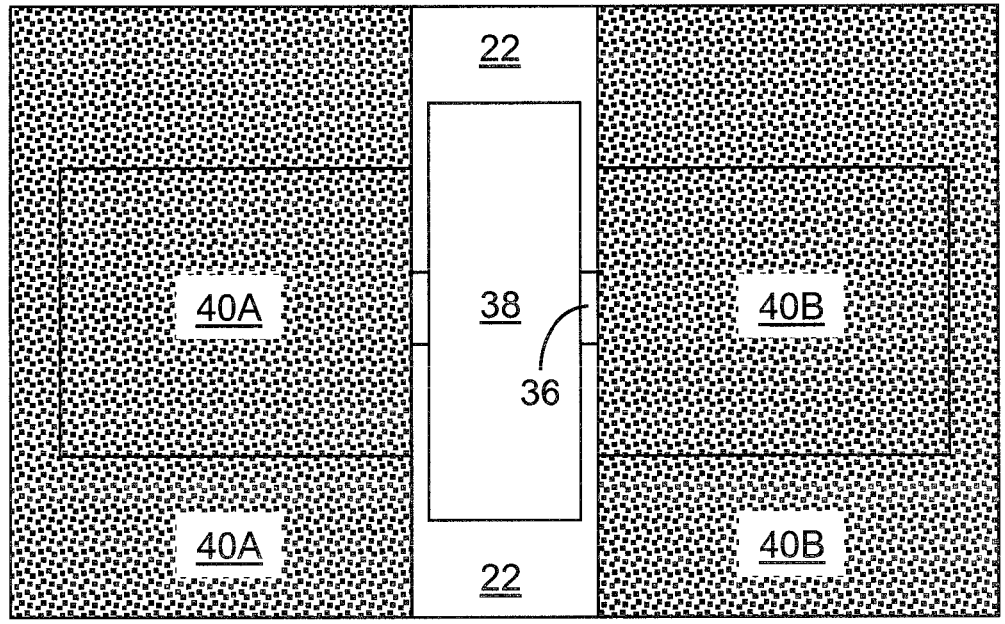
FIG. 8A is a top-down view of the exemplary semiconductor structure after formation of gate electrodes.
Figure 8B:
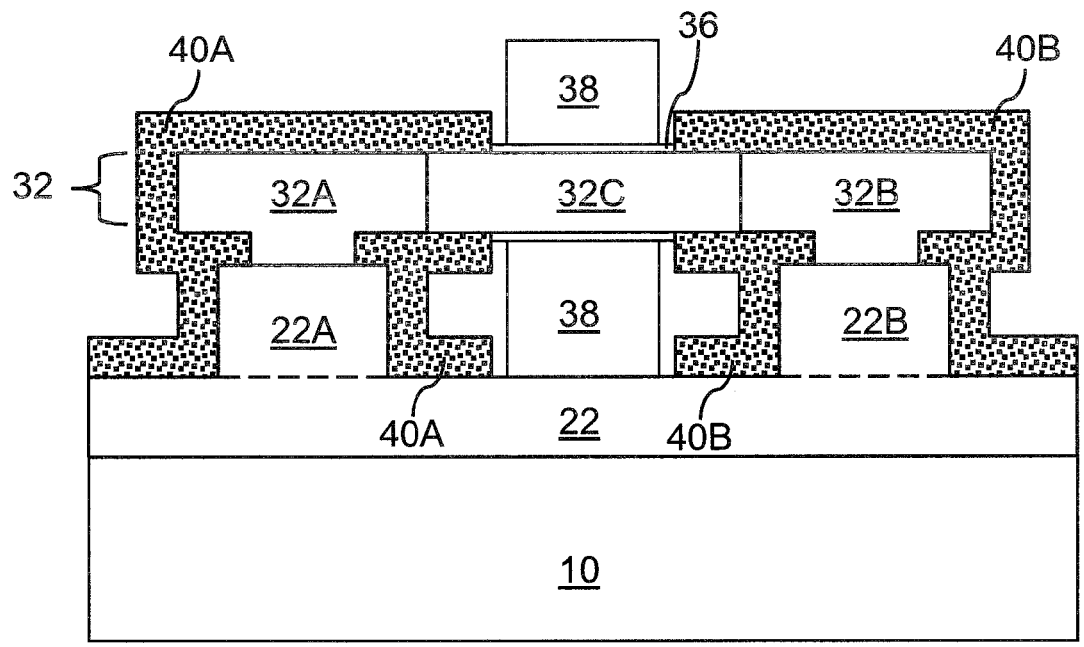
FIG. 8B is a vertical cross-sectional view of the exemplary semiconductor structure along the plane B-B' at the step corresponding to FIG. 8A.

Referring to FIGS. 8A and 8B, a gate electrode 38 is formed on and around the gate dielectric 36. By forming the gate electrode 38 on the gate dielectric 36 while the middle portion of the semiconductor nanowire 32C is longitudinally strained, the longitudinally strained atomic configuration of the semiconductor nanowire 32C is locked to the strained state by the combination of the gate dielectric 36 and the gate electrode 38. In other words, the gate dielectric 36 and the gate electrode 38 structurally support the semiconductor nanowire 32C as longitudinally strained. Any tendency for the semiconductor nanowire 32C to attain a different length by altering the longitudinal strain is counteracted and reduced by the atomic alignment between the semiconductor nanowire 32C and the assembly of the gate dielectric 36 and the gate electrode 38.

The gate electrode 38 comprises a conductive material such as a doped semiconductor material, a metal, a metallic alloy, a conductive compound of at least one metal, or combinations thereof. Preferably, the thickness of the deposited gate electrode material exceeds half the distance between the semiconductor nanowires 32C and the dielectric material layer 22 so that the second gate electrode 38 contains only one hole within which the semiconductor nanowire 32C is located.

In one embodiment, the gate electrode 38 comprises an amorphous or polycrystalline semiconductor material such as polysilicon, amorphous silicon, a silicon-germanium alloy, a silicon-carbon alloy, a silicon-germanium-carbon alloy, or a combination thereof. The gate electrode 38 may be in-situ doped, or may be doped by a subsequent ion implantation of dopant ions.

Alternately or additionally, the gate electrode 38 may comprise a metal gate material, which comprises a metallic conductive material. For example, the gate electrode 38 may comprise a material such as TaN, TiN, WN, TiAlN, TaCN, other conductive refractory metal nitride, or an alloy thereof. The metal gate material may be formed by chemical vapor deposition (CVD), physical vapor deposition (PVD), atomic layer deposition (ALD), etc. and comprising a conductive refractory metal nitride. In case the gate dielectric 36 comprises a high-k gate dielectric material, the metal gate material may be formed directly on the gate dielectric 36. The composition of the metal gate material may be selected to optimize threshold voltages of semiconductor devices to be subsequently formed in the semiconductor nanowire structure 32. The gate electrode 38 may include both a metal gate material and a semiconductor material.

Figure 9A:
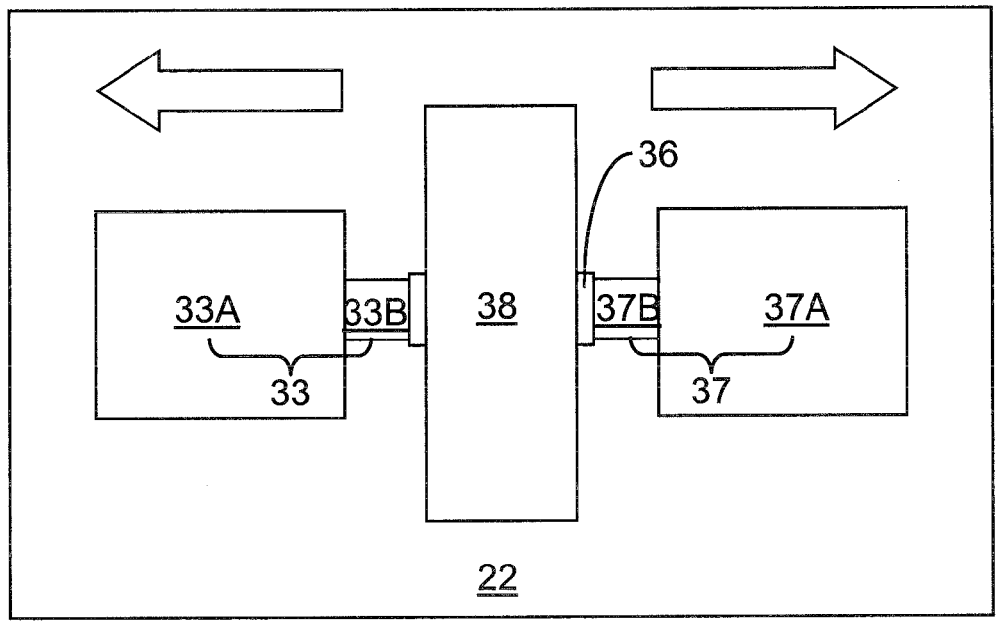
FIG. 9A is a top-down view of the exemplary semiconductor structure after removal of the stress-generating material portions in case a tensile longitudinal strain is generated in a channel region.
Figure 9B:
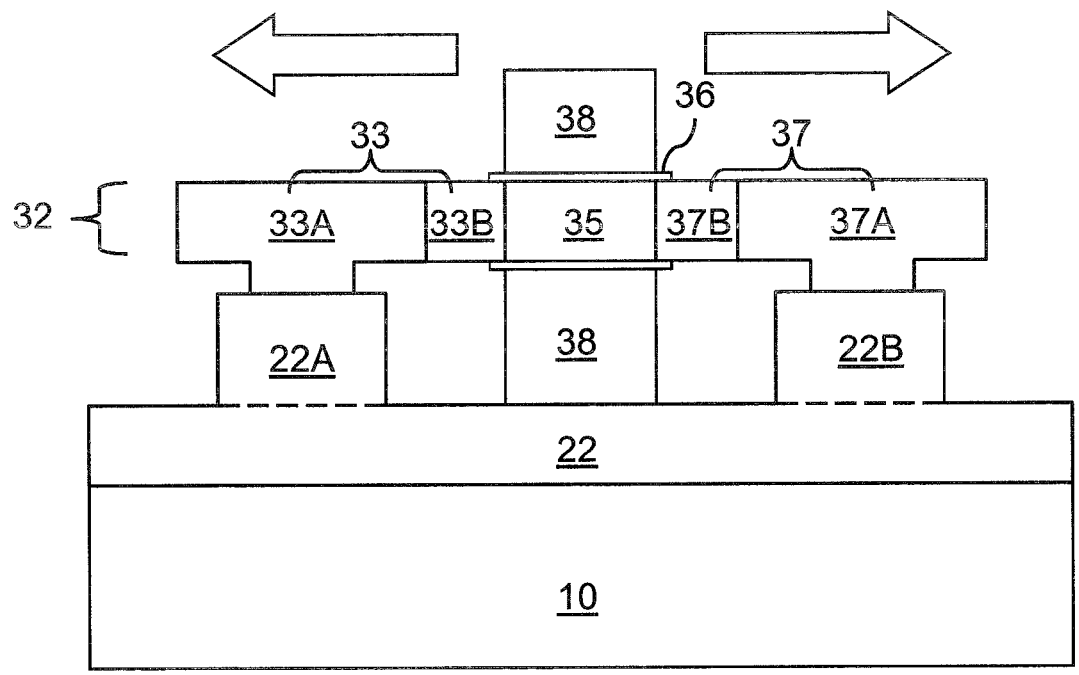
FIG. 9B is a vertical cross-sectional view of the exemplary semiconductor structure along the plane B-B' at the step corresponding to FIG. 9A.

Referring to FIGS. 9A and 9B, the first stress-generating portion 40A and the second stress-generating portion 40B are removed selective to the semiconductor nanowire structure 32, the gate electrode 38, and the dielectric material layer 22. An etch process such as a wet etch or a dry etch may be employed to remove the first and second stress-generating portions (40A, 40B). Preferably, the etch is selective to the gate dielectric 36 so that undercut of the gate dielectric around the edges of the gate electrode 38 is minimized. In case the first and second stress-generating portions (40A, 40B) includes a stress-generating silicon nitride material and the dielectric material layer 22 includes silicon oxide, a hot phosphoric acid etch may be employed to remove the first and second stress-generating portions (40A, 40B) selective to the semiconductor nanowire structure 32, the gate electrode 38, and the dielectric material layer 22.

The atomic registry between the semiconductor nanowire 32C (See FIGS. 8A and 8B) and the gate dielectric 36 is fixed while the middle portion of the semiconductor nanowire 32C is longitudinally strained and the atomic registry is structurally stabilized by subsequent formation of the gate electrode 38 directly upon the gate dielectric 36. The removal of the first and second stress-generating portions (40A, 40B) does not alter the longitudinal strain in the middle portion of the semiconductor nanowire 32C. Thus, the middle portion of the semiconductor nanowire 32C is inherently strained longitudinally, i.e., strained relative to a natural state in which no external stress is applied, even after the removal of the first and second stress-generating portions (40A, 40B).

In one embodiment, the first and second stress-generating portions (40A, 40B) apply a compressive stress to adjoined structures prior to removal. In this case, the middle portion of the semiconductor nanowire 32C is under longitudinal tensile strain prior to removal of the first and second stress-generating portions (40A, 40B). Because the longitudinal tensile strain is locked in place by the gate dielectric 36 and the gate electrode, the middle portion of the semiconductor nanowire 32C is under a longitudinal tensile strain even after removal of the first and second stress-generating portions (40A, 40B). Further, as the longitudinal tensile strain is relived to a small degree after the removal of the first and second stress-generating portions (40A, 40B) in the middle portion of the semiconductor nanowire 32C, a small amount of the longitudinal tensile strain in the middle portion of the semiconductor nanowire 32C is transferred to the end portions of the semiconductor nanowire 32C so that the entirety of the semiconductor nanowire 32C is longitudinally tensilely strained and has an inherent longitudinal tensile stress. The direction of the longitudinal tensile strain on the semiconductor nanowire 32C is schematically illustrated with arrows so the directions of the arrow indicate the direction of the stress applied to the semiconductor nanowire 32C. For example, the longitudinally strained middle portion of the semiconductor wire 32C may have an inherent tensile stress having a magnitude greater than 0.3 GPa.

Optionally, dielectric spacers (not shown) may be formed on the sidewalls of the gate electrode 38 as needed, for example, to control the overlap between the gate electrode 38 and source and drain regions of semiconductor nanowire transistors to be formed.

Dopants of the second conductivity type are implanted into the exposed portions of the semiconductor nanowire 32 employing the gate electrode 38 as an ion implantation mask. The first semiconductor pad 32A and the second semiconductor pad 32B are doped with dopants of the second conductivity type, which are herein referred to as a pad source portion 33A and a pad drain portion 37A. One end of the semiconductor nanowire 32C (See FIG. 8B) abutting the pad source portion 33A is also doped with dopants of the second conductivity type and is herein referred to as a nanowire source portion 33B. The pad source portion 33A and the nanowire source portion 33B have a doping of the second conductivity type and are collectively called a source region 33. The other end of the semiconductor nanowire 32C (See FIG. 8B) abutting the pad drain portion 37A is also doped with dopants of the second conductivity type and is herein referred to as a nanowire drain portion 37B. The pad drain portion 37A and the nanowire drain portion 37B have a doping of the second conductivity type and are collectively called a drain region 37. The middle portion of the semiconductor nanowire 32C (See FIG. 6B) that is not implanted with dopants of the second conductivity type has a doping of the first conductivity type, and is herein referred to as a channel region 35.

The channel region 35 laterally abuts the source region 33 and the drain region 37. The channel region 35, the source region 33, the drain region 37, the gate dielectric 36, and the gate electrode 38 collectively constitute a semiconductor nanowire transistor that controls the flow of current through the semiconductor nanowire (35, 33B, 37B). The boundary between the source region 33 and the channel region 35 is substantially vertically coincident with an edge of a gate electrode 38 overlying the semiconductor nanowire (35, 33B, 37B), and the boundary between the drain region 37 and the channel region 35 is substantially vertically coincident with another edge of the gate electrode 38.

Figure 10A:
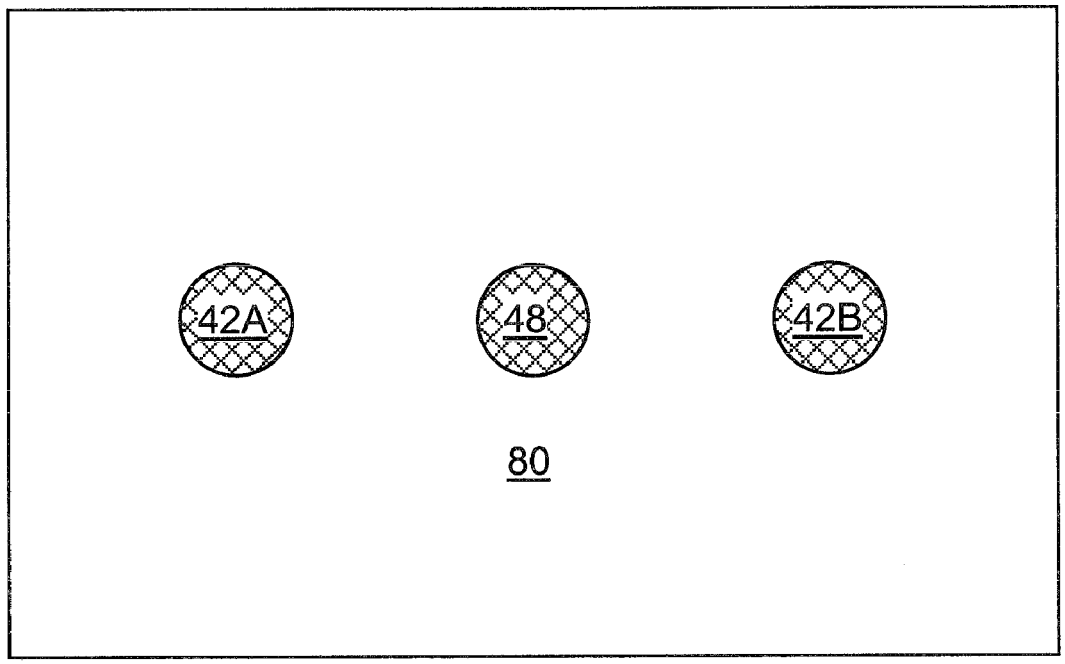
FIG. 10A is a top-down view of the exemplary semiconductor structure after formation of a middle-of-line (MOL) dielectric layer and contact vias.
Figure 10B:
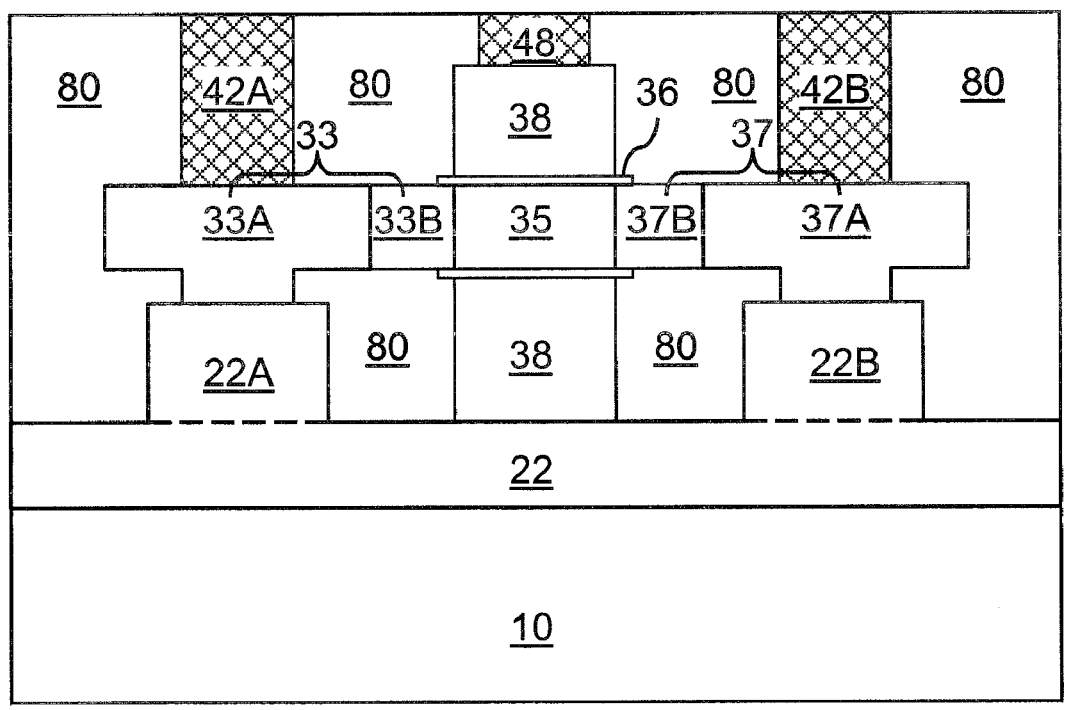
FIG. 10B is a vertical cross-sectional view of the exemplary semiconductor structure along the plane B-B' at the step corresponding to FIG. 10A.

Referring to FIGS. 10A and 10B, a middle-of-line (MOL) dielectric material layer 80 is formed over the first and second semiconductor nanowire transistors. The MOL dielectric material layer 80 may include a mobile ion diffusion barrier layer (not shown) which comprises a material that blocks the diffusion of mobile ions such as Na+ and K+. Typical material employed for the mobile ion diffusion barrier layer includes silicon nitride. The MOL dielectric material layer 80 may include for example, a CVD oxide, spin-on low dielectric constant material having a dielectric constant less than 2.8, an organosilicate glass or a CVD low dielectric material having a dielectric constant less than 2.8, or any other dielectric material that may be employed for a back-end-of-line (BEOL) dielectric layer in metal interconnect structures. For example, The CVD oxide may be an undoped silicate glass (USG), borosilicate glass (BSG), phosphosilicate glass (PSG), fluorosilicate glass (FSG), borophosphosilicate glass (BPSG), or a combination thereof. The MOL dielectric layer 80 fills the spaces between the dielectric material layer 22 and the semiconductor nanowire (35, 33B, 37B).

The MOL dielectric layer 80 is a dielectric material layer that is substantially stress-free, i.e., is not a stress-generating layer and does not apply compressive stress or a tensile stress to the semiconductor nanowire (35, 33B, 37B). For the purposes of the present invention, a dielectric material layer that generates stress less than 0.1 GPa in magnitude to surrounding elements is considered substantially stress-free. Preferably, the stress applied to surrounding elements is less than 0.3 GPa in magnitude. The semiconductor nanowire (35, 33B, 37B) is embedded in the MOL dielectric layer 80. A first portion of the MOL dielectric layer 80 underlies a portion of the semiconductor nanowire (35, 33B, 37B), overlies a portion of the dielectric material layer 22 which is an insulator layer, and laterally abuts the gate electrode 38 and the first dielectric pedestal 22A. A second portion of the MOL dielectric layer 80 underlies another portion of the semiconductor nanowire (35, 33B, 37B), overlies another portion of the dielectric material layer 22, and laterally abuts the gate electrode 38 and the second dielectric pedestal 22B.

Various contact via holes are formed in the MOL dielectric layer 80 and filled with a conductive material to from various contact vias. Specifically, at least one source-side contact via 42A is formed directly on the pad source portion 33A, at least one drain-side contact via 42B is formed directly on the pad drain portion 37A, and at least one gate-side contact via 48 is formed directly on the gate electrode 38. The top surfaces of the MOL dielectric layer 80, the at least one source-side contact via 42A, the at least one drain-side contact via 42B, and the at least one gate-side contact via 48 may be substantially coplanar after planarization of the MOL dielectric layer 80 and removal of the excess conductive material. Additional metal interconnect structures (not shown) including a first level metal wiring (not shown) may be formed above the MOL dielectric layer 80.

The semiconductor nanowire transistor includes a channel region 35 located at the middle portion of the semiconductor wire (35, 33B, 37B), a source region 33 laterally abutting the channel region 35 and including the pad source portion 33A, which is the first semiconductor pad 32A (See FIG. 8B), and a drain region 37 laterally abutting the channel region 35 and including the pad drain portion 37A, which is the second semiconductor pad 32B (See FIG. 8B). The first dielectric pedestal 22A vertically abuts the first semiconductor pad 32A (See FIG. 8B) and the second dielectric pedestal 22B vertically abuts the second semiconductor pad 32B (See FIG. 8B). The bottom surface of the gate electrode 38 abuts the dielectric material layer 22, which is an insulator layer.

The MOL dielectric layer 80, the at least one source-side contact via 42A, and the first dielectric pedestal 22A encapsulate the pad source portion 33A, which is the first semiconductor pad 32A (See FIG. 8B). The MOL dielectric layer 80, the at least one drain-side contact via 42B, and the second dielectric pedestal 22B encapsulate the pad drain portion 37A, which is the second semiconductor pad 32B (See FIG. 8B).

Figure 11A:
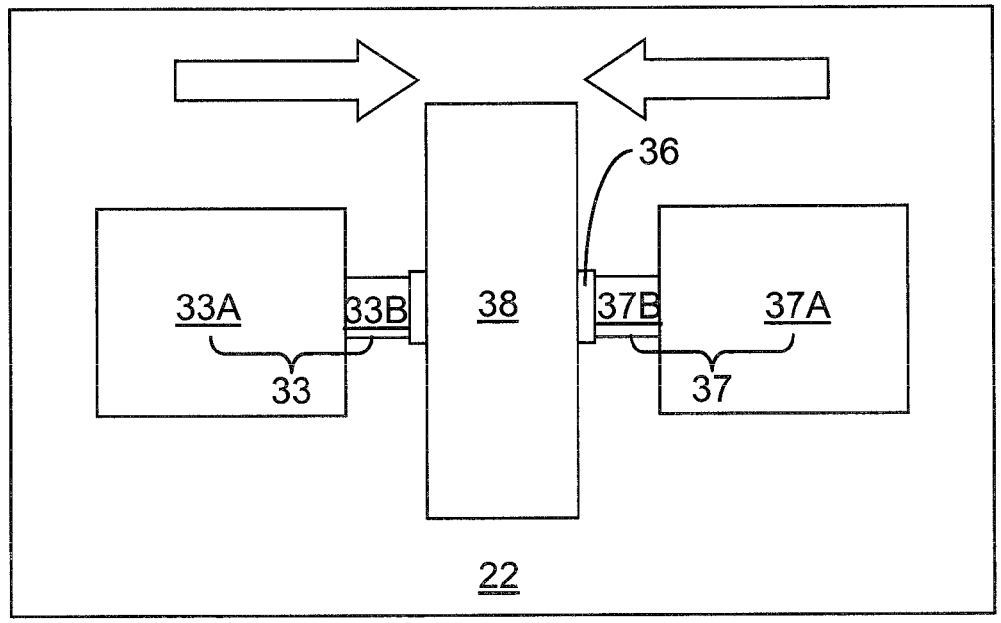
FIG. 11A is a top-down view of the exemplary semiconductor structure after removal of the stress-generating material portions in case a compressive longitudinal strain is generated in a channel region.
Figure 11B:
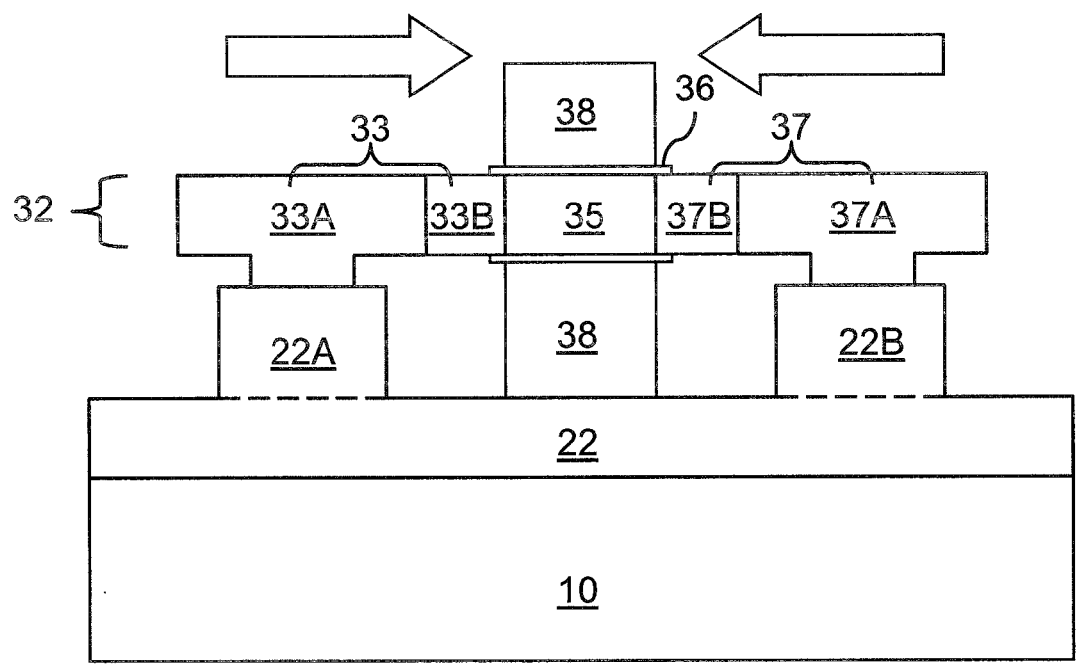
FIG. 11B is a vertical cross-sectional view of the exemplary semiconductor structure along the plane B-B' at the step corresponding to FIG. 11A.

Referring to FIGS. 11A and 11B, another embodiment of the present invention is shown at a step corresponding to FIGS. 9A and 9B. In this embodiment, the first and second stress-generating portions (40A, 40B) apply a tensile stress to adjoined structures prior to removal. The middle portion of the semiconductor nanowire 32C is under longitudinal compressive strain prior to removal of the first and second stress-generating portions (40A, 40B). Because the longitudinal compressive strain is locked in place by the gate dielectric 36 and the gate electrode, the middle portion of the semiconductor nanowire 32C is under a longitudinal compressive strain even after removal of the first and second stress-generating portions (40A, 40B). Further, as the longitudinal compressive strain is relived to a small degree after the removal of the first and second stress-generating portions (40A, 40B) in the middle portion of the semiconductor nanowire 32C, a small amount of the longitudinal compressive strain in the middle portion of the semiconductor nanowire 32C is transferred to the end portions of the semiconductor nanowire 32C. The entirety of the semiconductor nanowire 32C is longitudinally compressively strained and has an inherent longitudinal compressive stress. The direction of the longitudinal compressive strain on the semiconductor nanowire 32C is schematically illustrated with arrows so the directions of the arrow indicate the direction of the stress applied to the semiconductor nanowire 32C. For example, the longitudinally strained middle portion of the semiconductor wire 32C may have an inherent compressive stress having a magnitude greater than 0.3 GPa.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a semiconductor nanowire adjoined to a first semiconductor pad and a second semiconductor pad, wherein a middle portion of said semiconductor nanowire is longitudinally strained;
   a gate dielectric surrounding said longitudinally strained middle portion of said semiconductor nanowire;
   a dielectric material layer embedding said first and second semiconductor pads, wherein said dielectric material layer is substantially stress-free;
   at least one source-side contact via embedded in said dielectric material layer and contacting said first semiconductor pad; and
   at least one drain-side contact via embedded in said dielectric material layer and contacting said second semiconductor pad.

2. The semiconductor structure of claim 1, further comprising a gate electrode comprising a conductive material and surrounding said gate dielectric.

3. The semiconductor structure of claim 2, further comprising an insulator layer that includes a first dielectric pedestal and a second dielectric pedestal and underlying said semiconductor nanowire, wherein said first dielectric pedestal adjoins said first semiconductor pad, said second dielectric pedestal adjoins said second semiconductor pad, and said gate electrode adjoins said insulator layer.

4. The semiconductor structure of claim 1, further comprising:
a channel region located at said middle portion of said semiconductor nanowire;
a source region that includes said first semiconductor pad and adjoins said channel region; and
a drain region that includes said second semiconductor pad and adjoins said channel region.

5. The semiconductor structure of claim 4, wherein said source region includes a pad source portion located in said first semiconductor pad and a nanowire source portion located in said semiconductor nanowire, and wherein said drain region includes a pad drain portion located in said second semiconductor pad and a nanowire drain portion located in said semiconductor nanowire.

6. The semiconductor structure of claim 4, wherein a boundary between said source region and said channel region is substantially vertically coincident with an edge of a gate electrode overlying said semiconductor nanowire, and wherein a boundary between said drain region and said channel region is substantially vertically coincident with another edge of said gate electrode.

7. The semiconductor structure of claim 4, wherein said channel region has a doping of a first conductivity type, wherein said source region and said drain region have a doping of a second conductivity type, and wherein said second conductivity type is the opposite of said first conductivity type.

8. The semiconductor structure of claim 1, wherein a top surface of said dielectric material layer is substantially coplanar with a top surface of said at least one first contact via and a top surface of said at least one second contact via.

9. The semiconductor structure of claim 1, further comprising an insulator layer that includes a first dielectric pedestal and a second dielectric pedestal and underlying said semiconductor nanowire, wherein said first dielectric pedestal adjoins said first semiconductor pad, and said second dielectric pedestal adjoins said second semiconductor pad.

10. The semiconductor structure of claim 9, wherein a portion of said dielectric material layer underlies a portion of said semiconductor nanowire, overlies a portion of said insulator layer, and adjoins a gate electrode and one of said first dielectric pedestal and said second dielectric pedestal.

11. The semiconductor structure of claim 9, wherein said dielectric material layer, said at least one source-side contact via, and said first dielectric pedestal encapsulate said first semiconductor pad, and wherein said dielectric material layer, said at least one drain-side contact via, and said second dielectric pedestal encapsulate said second semiconductor pad.

12. The semiconductor structure of claim 1, wherein said longitudinally strained middle portion of said semiconductor wire has an inherent compressive stress having a magnitude greater than 0.3 GPa.

13. The semiconductor structure of claim 1, wherein said longitudinally strained middle portion of said semiconductor wire has an inherent tensile stress having a magnitude greater than 0.3 GPa.

14. The semiconductor structure of claim 1, wherein said semiconductor nanowire, said first semiconductor pad, and said second semiconductor pad comprise a single crystalline semiconductor material.

15. The semiconductor structure of claim 1, wherein said semiconductor nanowire has a lateral width from 1 nm to 20 nm.

16. A semiconductor structure comprising:
a semiconductor nanowire adjoined to a first semiconductor pad and a second semiconductor pad, wherein a middle portion of said semiconductor nanowire is longitudinally strained;
a gate dielectric surrounding said longitudinally strained middle portion of said semiconductor nanowire;
a dielectric material layer embedding said first and second semiconductor pads, wherein said dielectric material layer is substantially stress-free;
a gate electrode comprising a conductive material and surrounding said gate dielectric;
an insulator layer that includes a first dielectric pedestal and a second dielectric pedestal and underlying said semiconductor nanowire, wherein said first dielectric pedestal adjoins said first semiconductor pad, said second dielectric pedestal adjoins said second semiconductor pad, and said gate electrode adjoins said insulator layer.

17. The semiconductor structure of claim 16, further comprising:
a channel region located at said middle portion of said semiconductor nanowire;
a source region that includes said first semiconductor pad and adjoins said channel region; and
a drain region that includes said second semiconductor pad and adjoins said channel region.

18. The semiconductor structure of claim 17, wherein said source region includes a pad source portion located in said first semiconductor pad and a nanowire source portion located in said semiconductor nanowire, and wherein said drain region includes a pad drain portion located in said second semiconductor pad and a nanowire drain portion located in said semiconductor nanowire.

19. The semiconductor structure of claim 17, wherein a boundary between said source region and said channel region is substantially vertically coincident with an edge of a gate electrode overlying said semiconductor nanowire, and wherein a boundary between said drain region and said channel region is substantially vertically coincident with another edge of said gate electrode.

20. The semiconductor structure of claim 17, wherein said channel region has a doping of a first conductivity type, wherein said source region and said drain region have a doping of a second conductivity type, and wherein said second conductivity type is the opposite of said first conductivity type.

21. The semiconductor structure of claim 16, wherein said longitudinally strained middle portion of said semiconductor nanowire has an inherent compressive stress having a magnitude greater than 0.3 GPa.

22. The semiconductor structure of claim 16, wherein said longitudinally strained middle portion of said semiconductor nanowire has an inherent tensile stress having a magnitude greater than 0.3 GPa.

23. The semiconductor structure of claim 16, wherein said semiconductor nanowire, said first semiconductor pad, and said second semiconductor pad comprise a single crystalline semiconductor material.

24. The semiconductor structure of claim 16, wherein said semiconductor nanowire has a lateral width from 1 nm to 20 nm.

* * * * *